United States Patent [19]

Champlin

[11] Patent Number: 5,140,269
[45] Date of Patent: Aug. 18, 1992

[54] ELECTRONIC TESTER FOR ASSESSING BATTERY/CELL CAPACITY

[76] Inventor: Keith S. Champlin, 5437 Elliot Ave. South, Minneapolis, Minn. 55437

[21] Appl. No.: 579,817

[22] Filed: Sep. 10, 1990

[51] Int. Cl.$^5$ .................................. G01N 27/416
[52] U.S. Cl. ........................... 324/433; 324/430; 324/436; 320/48; 340/636
[58] Field of Search .............. 324/426, 430, 433, 435, 324/436; 320/48; 340/636

[56] References Cited

U.S. PATENT DOCUMENTS

| | | | |
|---|---|---|---|
| 3,873,911 | 3/1975 | Champlin | 324/29.5 |
| 3,886,443 | 5/1975 | Miyikawa et al. | 324/426 |
| 3,909,708 | 9/1975 | Champlin | 324/29.5 |
| 4,697,134 | 9/1987 | Burkum et al. | 320/48 |
| 4,816,768 | 3/1989 | Champlin | 324/428 |
| 4,825,170 | 4/1989 | Champlin | 324/436 |
| 4,881,038 | 11/1989 | Champlin | 324/426 |
| 4,912,416 | 3/1990 | Champlin | 324/430 |
| 4,929,931 | 5/1990 | McCuen | 324/426 X |
| 4,968,941 | 11/1990 | Rogers | 324/435 X |

OTHER PUBLICATIONS

DeBardelaben, Sheldon, "Determining the End of Battery Life," New York Telephone Company, 1986 IEEE, Ch. 2328, pp. 365-368.

Vaccaro, F. J. and Casson, P., "Internal Resistance: Harbinger of Capacity Loss in starved Electrolyte Sealed Lead Acid Batteries," AT&T Bell Laboratories, 600 Mountain Avenue, Murray Hill, NJ 07974, 1987 IEEE, Ch. 2477, pp. 128-131.

"IEEE Recommended Practice for Maintenance, Testings, and Replacement of Large Lead Storage Batteries for Generating Stations and Substations," The Institute of Electrical and Electronics Engineers, Inc., 345 East 47th St., New York, NY 10017, ANSI/IEEE Std. 450-1987, pp. 7-15.

Primary Examiner—Kenneth A. Wieder
Assistant Examiner—Glenn W. Brown
Attorney, Agent, or Firm—Kinney & Lange

[57] ABSTRACT

A self-contained electronic device instantaneously assesses the stored energy capacity of single, two-volt, lead-acid cells; or of batteries comprised of such cells. The testing device is electrically connected to the terminals of a cell or battery and measures its dynamic conductance with a small, time-varying signal. An internal conductance standard permits initial calibration of the device to assure accuracy of the cell/battery measurements. Means are provided for entering a "reference conductance", defined to be the dynamic conductance of an identically rated and constructed cell or battery having 100% energy capacity. The device displays either the test cell/battery's measured conductance in Siemens (mhos), or its "percent capacity" determined by appropriately scaling its measured conductance in accordance with the "reference conductance". When determining "percent capacity", an LED lights if the result is less than a preset threshold value. For single-cell operation, special design features permit energizing the higher current elements of the measuring circuit directly from two-volt cell undergoing test while energizing the lower current, but higher voltage, elements from a separate, low-power, dc source such as a small 9-volt transistor battery or an integral dc/dc converter powered by the cell undergoing test. This novel circuit arrangement results in the realization of a portable, self-contained, electronic instrument that provides an accurate, instantaneous, assessment of the "percent capacity" of a two-voltage cell, or a battery comprised of such cells, without requiring any connection to external power.

45 Claims, 7 Drawing Sheets

ELECTRONIC TESTER FOR ASSESSING BATTERY/CELL CAPACITY

BACKGROUND OF THE INVENTION

This invention relates to method and apparatus for instantaneously assessing the stored energy capacity of single, two-volt, lead-acid cells, and of batteries comprised of such cells. More specifically, it relates to specific adaptations of dynamic conductance testing technology, previously developed for determining available cranking power of automotive starting batteries, to the assessment of stored energy capacity of deep-cycle batteries and of their individual cells. Dynamic conductance technology specifically applicable to assessing cranking ability has been disclosed previously in U.S. Pat. Nos. 3,873,911, 3,909,708, 4,816,768, 4,825,170, 4,881,038, and 4,912,416 issued to Keith S. Champlin.

So-called "deep-cycle" lead-acid batteries are used in many applications requiring energy to be delivered continuously over relatively long periods of time. Such batteries, comprises of banks of series-connected two-volt cells, are used at electric generating plants, substations, telephone central offices, railroad signal sites, airport control towers, and countless other critical installations to provide secondary emergency power for use in the event of failure of a primary energy source. Applications requiring relatively long-term reliance on such secondary batteries include emergency lighting for hospitals and industrial plants, and uninterruptible energy supplies for critical communications equipment and computers. Individual cells of secondary batteries are often separate entities with accessible terminals. Such cells may be physically large and will sometimes weight many hundreds of pounds.

The primary mission of a secondary battery system is to supply a specific amount of energy, delivered over a period of hours. In many such applications, it is very desirable that each component cell or battery of the system be periodically tested in order to ensure that it will indeed be capable of delivering its assigned energy if, and when it is called upon to do so. Any cell or battery that is tested and found to have an inadequate energy capacity can then be replaced to ensure that the overall system is capable of fulfilling its role as an emergency energy source.

At the present time, the only available means for accurately assessing the energy capacity of a battery, or of an individual battery cell, is the timed-discharge test. This well-established testing procedure is fully described in Section 6 of ANSI/IEEE Standard 450—1987. Under this procedure, the battery is discharged with a fixed current; usually taken equal to the battery's ampere hour rating divided by its rated time (typically eight or ten hours). During the discharge, the terminal voltage of the battery and of each individual cell is monitored; and the time required to reach a particular "endpoint" voltage (usually 1.75 volts per cell) is recorded. A battery or individual cell's "Percent Capacity" may then be calculated from the formula:

$$\text{Percent Capacity} = \frac{\text{(time in minutes to "endpoint" voltage)}}{\text{(rated time in minutes)}} \times 100\% \quad (1)$$

Any cell or battery whose "Percent Capacity" is determined by this procedure to be 80% or less will generally be removed from service and replaced with a new cell or battery.

Although the conventional timed-discharge test described above has been widely used to assess energy storage capacity, it possesses several serious disadvantages. These include:

1. The test takes considerable time to perform (usually 8 or 10 hours).
2. Currents drawn may be relatively large and can thus require apparatus that is heavy and cumbersome.
3. After being tested, the battery must be recharged before it can be returned to service. This requires additional time.
4. Only a fixed number of charge-discharge cycles can be provided by a given battery. As a result, each timed-discharge test performed upon a battery removes potential service capability.

The possibility for developing an alternative to timed-discharge testing of cells and batteries has been suggested by the work of DeBardelaben (s. DeBardelaben, Intelec 86, Toronto, Canada, pp. 365-368). Using laboratory test equipment, DeBardelaben measured the complex impedance of lead-antimony telephone cells rated at 7000 ampere-hours. His analysis, which employed the mathematical technique of linear regression, disclosed a strong correlation between cell capacity and either the magnitude of cell impedance or its resistive real part. Further laboratory studies by Vaccaro and Casson (F. J. Vaccaro and P. Casson, "Internal Resistance: harbinger of Capacity Loss in Starved Electrolyte Sealed Lead Acid Batteries", Intelec 87, Stockholm, Sweden, pp. 128-131) showed that increased impedance and resistance were also good indicator of "dryout" of sealed-lead acid stationary batteries.

Testing of automotive batteries used in engine starting applications presents an entirely different problem. Unlike the deep-cycle battery's mission of supplying energy over an extended period, the primary mission of an automotive starting battery is to supply a large burst of power for a short duration of time. Accordingly, automotive batteries are conventionally tested by means of a short-duration (e.g., 15 second) load test. However, the load test, like the timed-discharge test, also requires heavy, cumbersome, equipment and suffers from other serious disadvantages. Accordingly, a practical alternative to the common load test of automotive starting batteries is taught in U.S. Pat. No. 3,873,911, U.S. Pat. No. 3,909,708, and U.S. Pat. No. 4,816,768. These three patents disclose self-contained electronic apparatus employing small-signal ac measurements of the battery's dynamic conductance (i.e., the real part of its complex admittance) to conveniently and accurately assess an automotive battery's ability to supply cranking power. The patents teach that a battery's dynamic conductance is directly proportional to its dynamic power; the maximum power that the battery can deliver to a load. Measurements of dynamic conductance correlate strongly with a battery's power rating expressed in Cold Cranking Amperes (CCA) and therefore provide a direct measure of the battery's high-current cranking capability. Virtually millions of measurements performed on automotive starting batteries over the course of fifteen years have fully corroborated these teaching and have proven the validity of the dynamic conductance method for testing engine-starting batteries.

Unfortunately, the dynamic conductance method of assessing cranking power cannot be directly applied to the assessment of energy capacity, as would be desired for batteried in deep-cycle applications. Because of the many disadvantages to the timed-discharge test however, it would be obviously desirable to provide a simple, instantaneous, test — such as a dynamic conductance test — that could be used to assess stored energy capacity without requiring that the battery be discharged in the process. However, no simple relationship has heretofore been recognized between a cell's dynamic conductance and its stored energy capacity or ampere-hour rating. Thus, it is not obvious a priori that small-signal measurements of a cell's dynamic conductance could be easily related to its stored energy capacity in any meaningful way.

In addition, the dynamic conductance testing apparatus disclosed in the three U.S. Pats. cited above all derive the power required by their electronic circuits from the 6-volt or 12-volt automotive battery undergoing test. This desirable feature permits these dynamic conductance testers to be conveniently used in the field, entirely independent of the ac mains. However, the terminal voltage of a single, fully-charged, lead-acid cell is only about 2.1 volts — a voltage that is insufficient to power the electronic circuitry disclosed in the cited patents. Furthermore, because of the extremely large conductance of many secondary battery cells, several amperes of ac current would be required to pass through the cell in order to develop sufficient ac voltage to accurately measure dynamic conductance, If this current were to be derived from on-board batteries, these batteries would, of necessity, be large or short-lived. Moreover, any connections to external power sources could adversely effect the isolation required between the "current-feedback loop" and the "voltage-sensing loop" of the measuring circuit's "four-point probe" architecture. Any coupling resulting from such additional power connections could seriously degrade the measuring circuit's ability to suppress errors associated with spurious lead-wire resistance.

Accordingly, even if a simple relationship between dynamic conductance and stored energy capacity could be established, it is not at all obvious how the previously disclosed dynamic conductance testing apparatus could be adapted to test single cells without introducing excessive measurement errors and without necessitating the use of either a large auxiliary battery supply or a separate connection to the ac mains.

SUMMARY OF THE INVENTION

I have extensively analyzed numerous timed-discharge test results along with dynamic conductance measurements performed on deep-cycle batteries, and on single cells thereof. On the basis of this analysis, I have found that a cell's dynamic conductance correlates relatively poorly with its stored-energy rating as expressed in ampere-hours. However, I have established that a very linear relationship exists between the total energy delivered in a timed-discharged test and the dynamic conductance measured before the discharge test is performed; as long as all of the cells tested are rated and constructed identically and are fabricated by the same manufacturer. By first establishing a "a reference conductance", defined as the dynamic conductance of a representative cell or battery that possesses 100% energy capacity, it is possible to accurately and instantaneously determine the percent capacity of all similarly constructed test cells or batteries by measuring their dynamic conductance and comparing same with the "reference conductance". An appropriate "reference conductance" value can be readily determined by performing a timed-discharge test and a dynamic conductance measurement on a single representative cell or battery from the group.

A self-contained electronic device that instantaneously assesses the stored energy capacity of single, two-volt, lead-acid cells, or of batteries comprised thereof, is disclosed herein below. The testing device is electrically connected to the terminals of a cell or battery and measures its dynamic conductance with a small, time-varying signal. An internal conductance standard permits initial calibration of the device to assure accuracy of the cell/battery measurements. Means are provided for entering a "reference conductance", defined to be the dynamic conductance of an identically rated and constructed cell or battery having 100% energy capacity. The device displays either the test cell/battery's measured conductance is siemens (mhos), or its "percent capacity" determined by appropriately scaling its measured conductance in accordance with the "reference conductance". When determining "percent capacity", an LED lights if the result is less than a preset threshold value. For single-cell operation, special design features permit energizing the higher current elements of the measuring circuit directly from the two-volt cell undergoing test while energizing the lower current, but higher voltage, elements from a separate, low-power, dc source such as a small 9-volt transistor battery or an integral dc/dc converter powered by the cell undergoing test. This novel circuit arrangement results in the realization of a portable, self-contained, electronic instrument that provides an accurate, instantaneous, assessment of the "percent capacity" of a two-volt cell, or a battery comprises of such cells, without requiring any connection to external power.

DETAILED DESCRIPTION

Figure 1:
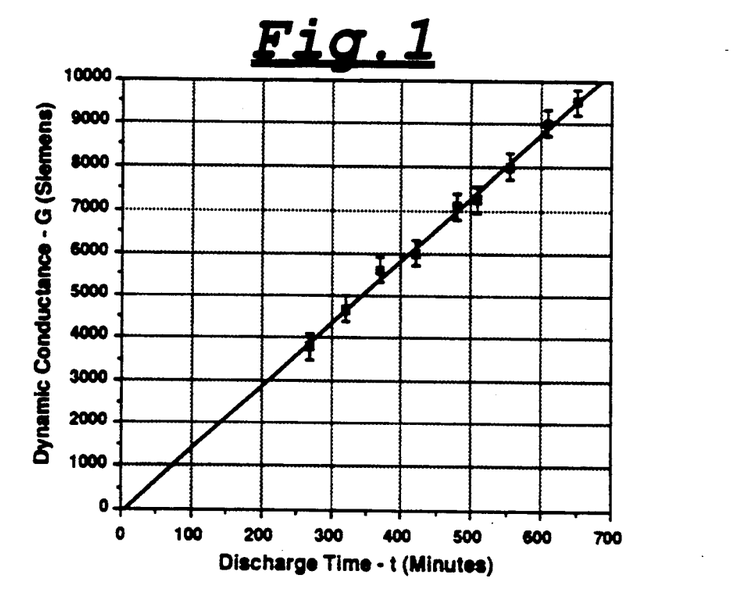
FIG. 1 is a plot of measured dynamic conductance versus discharge time obtained in timed-discharge tests on nine identically constructed and rated stationary battery cells discharged at their ten-hour rate.

FIG. 1 discloses experimental data relating dynamic conductance G, measured before discharge, to the time t(in minutes) required to reach 1.75 volts in timed-discharge tests performed at a ten-hour rate. These data were obtained from a group of nine identically rated and constructed stationary battery cells — all fabricated by the same manufacturer. The graph of FIG. 1 discloses an empirical relation between dynamic conductance and discharge time that is very nearly linear. Such extreme linearity was quite unexpected but is typical of results obtained with many different cells; just so long as the cells are grouped together according to their rating, construction type, and manufacturer.

The reason for the observed linear relationship between the two seemingly unrelated quantities (dynamic conductance and time) can be explained on the basis of a fairly simple model. The cell's dynamic conductance can be approximated by the well-known formula for the conductance of a uniform resistor $$G = \sigma A/L \text{ siemens} \quad (2)$$

where $\sigma$ is the effective conductivity of the current path, L is the effective length of the current path, and A is the effective area of the plates.

One sees from equation (2) that the cell conductance G is directly proportional to A, the effective area of the plates. On the other hand, the length of time that the cell can sustain a discharge at a given constant current will be proportional to the number of chemical reaction sites available before the discharge begins and is therefore also proportional to the effective plate area. Consequently, both measured quantities— dynamic conductance and discharge time — are proportional to effective plate area before discharge; and hence are linearly related to one another. The other variables in equation (2) — and indeed the many variables contained in the complex mechanisms which effect the timed-discharge test — will depend upon specific details of cell construction such as cell dimensions, plate spacing, separator type and porosity, acid specific gravity, etc. However, for cells grouped together according to their specific ratings and construction types, these other variables will be nearly equal from cell to cell and will therefore have little effect. This simple explanation provides the physical basis for the nearly linear empirical relationship observed between dynamic conductance and stored energy capacity disclosed in FIG. 1.

According to equation (1), 100% capacity corresponds to discharge time (to an "endpoint" voltage of 1.75 volts) equal to the "rated time". For the timed-discharge test data presented in FIG. 1, this "rated time" if 600 minutes. If one defines a "reference conductance", $G_{ref}$, as the dynamic conductance of an identically rated and constructed cell having 100% energy capacity, the linear relationship between G and t disclosed in FIG. 1 can be expressed as $$G/G_{ref} = t/t_{rated}, \quad (3)$$

where $t_{rated} = 600$ minutes.

Figure 2:
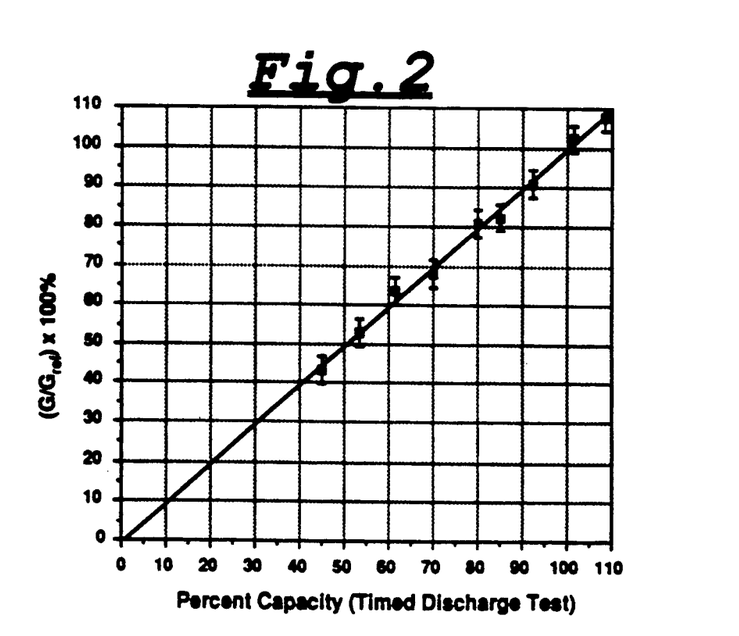
FIG. 2 is a normalized plot showing the data displayed in FIG. 1 presented as percent of reference conductance versus percent capacity derived according to equation (1).

FIG. 2 discloses a normalized presentation of the data disclosed in FIG. 1. The data plotted along the horizontal axis of FIG. 2 are "percent capacity" values derived from the timed-discharge test data according to equation (1). Data plotted along the vertical axis are normalized dynamic conductance values given by $(G/G_{ref}) \times 100\%$, where the value $G_{ref} = 8770$ S has been obtained from the data of FIG. 1. One notes that the relation between the two percentage quantities plotted in FIG. 2 can be accurately approximated by a straight line having unity slope, thus indicating that the two quantities are very nearly equal. Accordingly, to a very high degree of precision, one can write $$\text{Percent Capacity} = (G/G_{ref}) \times 100\% \quad (4)$$

Equation (4) provides the basis for a practical alternative to the use of the timed-discharge test and equation (1) for assessing energy capacity. Equation (4) discloses that a cell's stored energy capacity can alternatively be instantaneously determined by measuring its dynamic conductance, G, and comparing same to an appropriately determined reference dynamic conductance, $G_{ref}$. All that is required is that $G_{ref}$ be known. Rearranging equation (3) leads to the following expression for $G_{ref}$:

$$G_{ref} = G \times (t_{rated}/t). \quad (5)$$

By utilizing equation (5), the reference dynamic conductance appropriate to a group of cells can be readily determined from measurements on a single cell of the group by performing both a timed-discharge test (to determine t) and a dynamic conductance test (to determine G) on the single representative cell. Thus, it is not necessary that an actual "reference cell", i.e., a representative cell possessing 100% energy capacity, physically exist.

The measuring apparatus to be described herein below is especially adapted to perform the following two important functions;

1. The apparatus provides a direct measurement of a cell/battery's dynamic conductance and displays the result in siemens (mhos). This value, when obtained from a representative cell/battery, is sued in conjunction with results of a timed-discharge test on the same cell/battery to establish $G_{ref}$ according to equation (5).

2. The apparatus permits entering the value of $G_{ref}$ so established. Subsequent measurements of dynamic conductance are then appropriately scaled in accordance with $G_{ref}$ to determine a particular cell/batter's "Percent Capacity" according to equation (4). The "Percent Capacity" value determined in this manner is conveniently displayed directly. In addition, an LED lights if the result is less than a preset threshold value.

Figure 3:
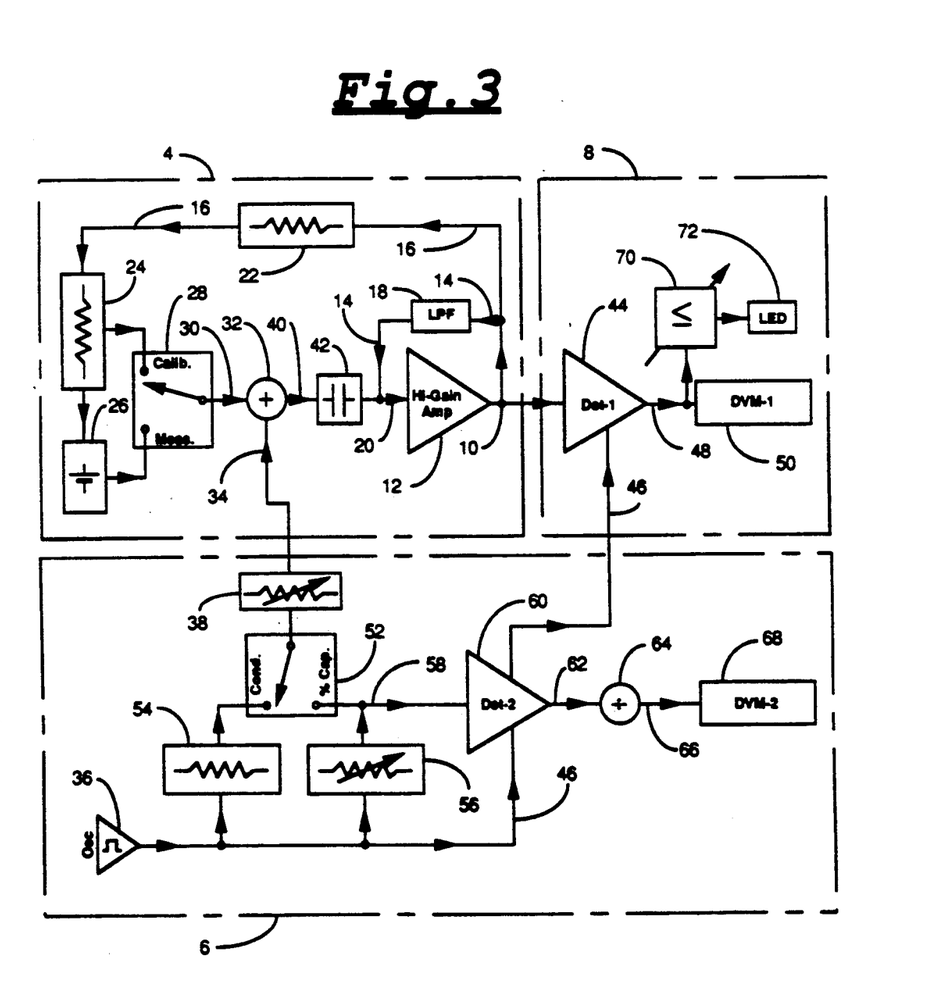
FIG. 3 is a simplified block diagram of an electronic tester for assessing battery/cell capacity in accordance with the present invention.

Referring now to FIG. 3, a simplified block diagram of an electronic tester for assessing batter/cell energy capacity is disclosed. For ease of discussion, the block diagram of FIG. 3 is divided into three sections: an amplifier/power supply section 4, an oscillator/attenuator section 6, and a detector/display section 8.

Referring first tot eh amplifier/power supply section 4, signals representative of the signal at output 10 of high-gain amplifier cascade 12 are fed back to the input 20 of high-gain amplifier cascade 12 by means of two feedback paths; internal feedback path 14 and external feedback path 16. Internal feedback path 14 includes low-pass filter (LPF) 18 and feeds a signal directly back to input 20 of high-gain amplifier cascade 12. The purpose of internal feedback path 14 and low-pass filter 18 is to provide large dc feedback but very little ac feedback at the measuring frequency in order to stabilize the operating point of high-gain amplifier cascade 12 without appreciably reducing its ac voltage gain. External feedback path 16 contains resistive network 22 and feeds back a signal current that passes through both a conductance standard 24 and the cell/battery undergoing test 26. Mode selector switch 28 selects either of two operational modes: "Calibrate" and "Measure". In the "Calibrate" mode, the signal voltage developed across conductance standard 24 is sensed and applied to input 30 of summation circuit 32. In the "Measure" mode, the signal voltage developed across the cell/battery undergoing test 26 is sensed and applied to input 30 of summation circuit 32. Summation circuit 32 combines the signal voltage received at input 30 with a 10 Hz periodic square-wave signal voltage 34 derived from oscillator/attenuator section 6. The resulting composite signal voltage at output 40 of summation circuit 32 is coupled to input 20 of high-gain amplifier cascade 12 by means of capacitive coupling network 42.

By virtue of the very large ac signal gain provided by high-gain amplifier 12 along with the negative feedback provided by external feedback path 16, the composite ac signal voltage at input 20 of high-gain amplifier 12 is essentially zero. Accordingly, the ac signal voltages at inputs 30 and 34 of summation circuit 32 are nearly equal to one another and of opposite phase. Thus, with mode selector switch 28 in the "Calibrate" position, the ac signal voltage developed across conductance standard 24 is equal in amplitude to the 10 Hz periodic square-wave ac signal voltage at 34. Similarly, with mode-selector switch 28 in the "Measure" position, the ac signal voltage developed across the cell/battery undergoing test 26 is equal in amplitude to the 10 Hz periodic ac square-wave signal voltage at 34.

The ac signal voltage at output 10 of high-gain amplifier 12 is proportional to the ac signal current fed back through external feedback path 16 which produces the ac signal voltage at 30 that is equal and opposite to that at 34. As a result, the ac signal voltage at 10 is proportional to the ac oscillator signal voltage at 34. In addition, when mode selector switch 28 is in the "Calibrate" position, the ac signal voltage at 10 is proportional to the dynamic admittance of conductance standard 24; and when mode selector switch 28 is in the "Measure" position, it is proportional to the dynamic admittance of cell/battery 26.

The total voltage at output 10 of high-gain amplifier 12 comprises a dc bias component along with an ac signal component. The dc bias voltage is ignored while the ac signal voltage is detected and accurately converted to a dc signal voltage by a synchronous detector Det-1 44 in detector/display section 8. The dc signal voltage at Det-144 output 48 is displayed on a digital voltmeter DVM-1 50. Detector Det-1 44 is switched on and off in phase synchronism with a signal from oscillator and attenuator section 6 conducted through synchronizing signal path 46. As a result, the dc output voltage of DET-1 at 48 is proportional to the component of the ac signal voltage at 10 that is in phase with the 10 Hz oscillator signal. The dc voltage displayed on DVM-1 50 is therefore proportional to the ac oscillator signal voltage at 34. In addition, when mode selector switch 28 is in the "Calibrate" position, the voltage displayed on DVM-1 50 is proportional to the dynamic conductance of conductance standard 24; and when mode selector switch 28 is in the "Measure" position it is proportional to the dynamic conductance of cell/battery 26.

In oscillator/attenuator section 6, function selector switch 52 routes the 10 Hz periodic square-wave signal from oscillator 36 to calibration-adjustment attenuator 38 via either one of two signal paths. When function selector switch 52 is in the "Conductance" position, the signal is routed through fixed attenuator 54. The value of fixed attenuator 54 is chosen such that DVM-1 50 displays dynamic conductance directly in siemens. With function selector switch 52 in the "Percent Capacity" position, the signal is routed through variable attenuator 56. Variable attenuator 56 is used to enter a predetermined value of reference conductance, $G_{ref}$. Under these conditions, the signal applied to Digital voltmeter DVM-1 50 is proportional to measured dynamic conductance but is scaled according to the value of $G_{ref}$ represented by the setting of variable attenuator 56. These conditions are appropriate for comparing the measured dynamic conductance with $G_{ref}$ and displaying "Percent Capacity" defined by equation (5) on DVM-1 50.

The reference conductance setting of variable attenuator 56 can be simply indicated with a scale of numbers laid out around an associated dial in the conventional manner. However, a more precise amens for indicating $G_{ref}$ is disclosed in section 6 of FIG. 3. The ac signal output of variable attenuator 56 is sampled at 58. The amplitude of this ac signal is inversely proportional to the value of $G_{ref}$ that corresponds to the setting of variable attenuator 56. The ac signal at 58 is applied to the input of synchronous detector Det-2 60 to produce a dc signal voltage at 62 having voltage level inversely proportional to $G_{ref}$. The dc voltage at 62 is then mathematically inverted by analog divider chip 64 to produce a dc signal at 66 having voltage level directly proportional to $G_{ref}$. This inverted signal voltage is applied to digital voltmeter DVM-2 68 thus permitting the appropriate value of $G_{ref}$ to be displayed directly on DVM-2 68.

Preliminary calibration of the apparatus disclosed in FIG. 3 is accomplished by setting mode selector switch 28 to the "Calibrate" position and setting function selector switch 52 to the "Conductance" position. Calibration attenuator 38 is then adjusted to display the appropriate value of the conductance standard 24 in siemens (mhos) on DVM-1 50. Conductance standard 24 comprises a segment of wire having length precisely chosen to provide a convenient conductance value. For example, a conductance value of 1000 siemens at 20° C. can be realized with a segment of #18 AWG hard-drawn copper wire having length of precisely 1.88 inches. After initial adjustment of calibration attenuator 38, mode switch 28 is set to the "Measure" position. Then with function switch 52 in the "Conductance" position, the measured dynamic conductance (in siemens) of a test cell/battery will be accurately displayed on DVM-1 50. With function switch 52 in the "Percent Capacity" position, DVM-1 50 displays the measured percent capacity of the test cell/battery determined according to equation (4), utilizing the value of $G_{ref}$ entered on variable attenuator 56 and displayed on DVM-2 68. In addition, voltage comparator 70 is actuated by the same voltage at 48 as DVM1 50 and can be preset to a convenient threshold level. Accordingly, any value of "Percent Capacity" that is less than a particular "pass/fail" threshold, e.g., 80%, will cause LED 72 to light.

Figure 4:
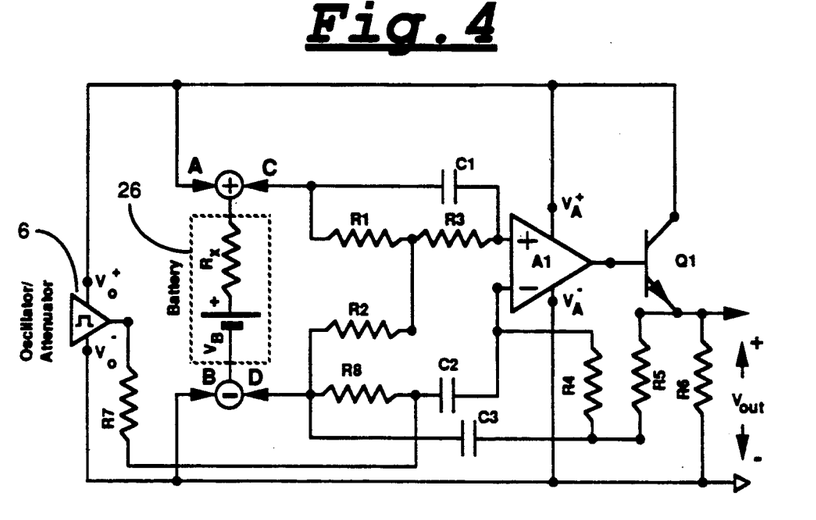
FIG. 4 is a simplified schematic diagram of a portion of the amplifier/ power supply section of the block diagram of FIG. 3 showing interconnections between the oscillator/attenuator section, high-gain amplifier, and battery undergoing test, in accordance with the prior art teaching of U.S. Pat. No. 4,816,768.

FIG. 4 discloses a simplified schematic diagram of a portion of the amplifier/power supply section 4 of the block diagram of FIG. 3, arranged in accordance with the teaching of U.S. Pat. No. 4,816,768. Operational amplifier A1 along with its dc biasing resistors R1, R2, and R3, and transistor Q1 connected as an emitter follower, comprise high-gain amplifier cascade 12 of FIG. 3. In addition, resistors R4 and R5 along with capacitor C3 comprise low pass filter 18; resistor R6 comprises resistive network 22; and capacitors C1 and C2 comprise capacitive coupling network 42. Battery 26 is represented in FIG. 4 by its Thevenin's equivalent circuit comprising a battery emf $V_B$ in series with an internal battery resistance $R_x$. The periodic square-wave signal presented to summation circuitry 32 by oscillator/attenuator 6 at 34 is represented in FIG. 4 by the ac signal voltage developed across "viewing" resistors R8 by virtue of its connection to oscillator/attenuator 6 through "injection" resistor R7. Summation circuitry 32 comprises the series interconnection of the oscillator signal voltage developed across R8 and the ac signal voltage developed across battery 26 as sensed by the two connections C and D contacting battery 26. The amplifier output voltage at 10 of FIG. 3 is represented as $V_{out}$ developed across R6 in FIG. 4. This voltage consists of a dc bias component along with an ac signal component. The dc bias component is equal to the dc voltage at the noninverting (+) input of operational amplifier A1. The ac signal component is proportional to both the level of the oscillator signal across R8, and also to the reciprocal of the battery resistance $1/R_x$.

As is fully explained in U.S. Pat. No. 4,816,768, the circuit of FIG. 4 utilizes two separate contacts to each of the two battery terminals and thus exemplifies "four-point probe" architecture. Such architecture permits accurate measurement of battery conductance to be obtained, even though the spurious resistance of the lead wires and battery contacts are several orders of magnitude larger than the internal resistance of the battery. In order for the circuit to function properly however, a large degree of isolation must exist between the "feedback current loop" and the "voltage sensing loop". In FIG. 4, the "feedback current loop" comprises the circular current path through the battery via contacts A and B, npn power transistor Q1, and feedback resistor R6. The "voltage sensing loop" comprises the signal voltage sensed across the battery at contacts C and D, "viewing" resistor R8, the two coupling capacitors C1 and C2, and the differential input of operational amplifier A1.

In the circuit of FIG. 4, the battery undergoing test supplies the power required by oscillator/attenuator 6, operational amplifier A1, and transistor Q1; all by means of "feedback current loop" contacts A and B. By separately utilizing "voltage sensing" contacts C and D along with voltage dividing resistors R1 and R2 to establish the requisite bias voltage at the noninverting input of operational amplifier A1, extreme isolation between the "voltage sensing loop" and the "feedback current loop" is achieved. The dc bias voltage at the noninverting input is equal to the battery voltage $V_B$ multiplied by the "splitting factor" associated with voltage divider resistors R1 and R2. Because of the effect of the dc negative feedback through R4 and R5, this bias voltage is also equal to the bias voltage component across "current loop" feedback resistor R6. Note that with this current of transistor Q1, depends on $V_b$, the voltage of the battery undergoing test.

With the circuit of FIG. 4, the only coupling between the two loops results from the fact that the oscillator/attenuator 6, which is powered from "feedback current loop" contacts, is connected to the "voltage sensing loop" via "injection" resistor R7. However, as the analysis in U.S. Pat. No. 4,816,768 established, coupling due to this mechanism can be made negligibly small by making R7 sufficiently large.

The circuit disclosed in FIG. 4 is totally powered by the battery being tested and thus requires no connections to ac mains or other sources of power. This is a highly desirable feature, particularly when testing batteries in the field. Unfortunately however, the circuit of FIG. 4 is incapable of testing single cells since a fully-charged lead-acid cell supplies only about 2.1 volts; a value insufficient for powering operational amplifiers and other electronic components used in the battery tester. The fundamental design problem is to develop a measuring circuit capable of accurately testing single cells; without sacrificing portability, and without increasing loop coupling and thus adversely affecting measurement accuracy.

Figure 5:
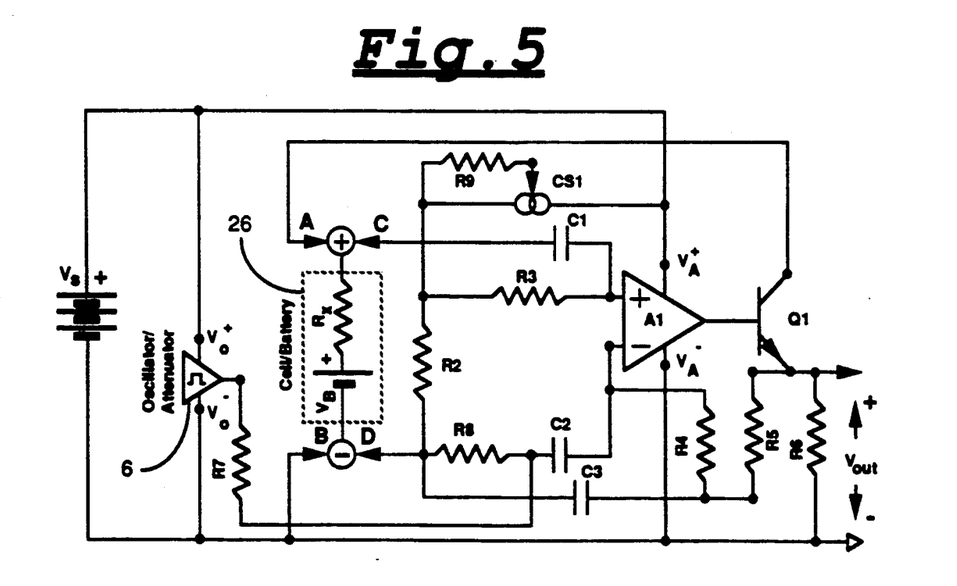
FIG. 5 is a simplified schematic diagram, similar to FIG. 4, disclosing interconnections between the oscillator/attenuator section, high-gain amplifier, and battery undergoing test, of an embodiment configured in accordance with principles of the present invention.

FIG. 5 discloses a practical solution to this problem in accordance with principles of the present invention. In the circuit of FIG. 5, the cell/battery undergoing test still supplies power to the high-current circuit elements; the npn power transistor Q1 and its associated feedback resistor R6. However, the other active circuit elements — the oscillator/attenuator 6 and operational amplifier A1 — are powered by a separate auxiliary power supply, $V_S$. The two power supplies come in contact with one another at only one point, the battery contact B, to thereby establish a common ground reference. The input bias voltage at the noninverting input of operational amplifier A1 is established by circuitry connect to power supply $V_S$. However, spurious coupling between the "voltage sensing loop" and the auxiliary power supply $V_S$ is avoided by utilizing isolation provided by a current source CS1 having a dynamic resistance that is essentially infinite. Such a high-impedance current sources can be realized with a conventional integrated circuit such as the LM334 available from National Semiconductor Corporation. With this IC, the dc current passing through resistor R2 is equal to 67 millivolts divided by the resistance of R9. Multiplying this dc current by the resistance of R2 yields the dc bias voltage at the noninverting input of A1; and hence the dc bias component established across feedback resistor R6. Note that the bias voltage established across resistor R6, and hence the dc bias current of transistor Q1, is independent of the cell/battery voltage $V_B$ with this configuration.

An inherent advantage to the circuit of FIG. 5 follows from the fact that the high current portion of the circuit, the "feedback current loop", is still supplied by the cell/battery undergoing test. As discussed in U.S. Pat. No. 4,816,768, transistor Q1 functions as a class-A linear amplifier. Its current therefore consist of a constant dc bias current along with time-varying current excursions above and below this dc value. Since the conductance of large cells can be in the range of thousands of siemens, current excursions in the range of 5 amperes may be required to develop sufficient ac voltage across the cell to obtain accurate measurements. Accordingly, dc bias currents through Q1 of the order of amperes will be required. With the circuit disclosed in FIG. 5, these large currents are supplied by the cell/battery undergoing test. On the other hand, the elements of the circuit that require voltages larger than two volts will draw currents that are only of the order of a few milliamperes and can thus be conveniently powered by a small dry battery such as a 9-volt transistor battery. Accordingly, portability need not be sacrificed to obtain single-cell capability with the circuit disclosed in FIG. 5.

Figure 6:
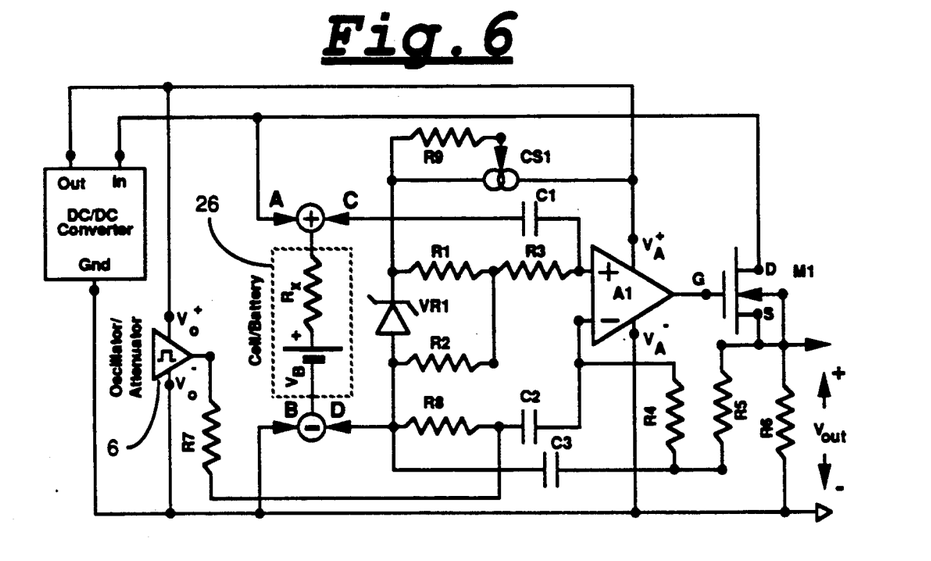
FIG. 6 is a simplified schematic diagram, similar to FIG. 5, disclosing interconnections between the oscillator/attenuator section, high-gain amplifier, and battery undergoing test, of another embodiment configured in accordance with principles of the present invention.

Referring now to FIG. 6, several improvements to the circuit of FIG. 5 are disclosed. First of all, the battery power supply, $V_S$, has been replaced by a dc/dc converter that receives its input power from the cell/battery undergoing test via "current loop" contacts A and B. This enhancement makes the circuit totally self-powered and removes the need for charging or replacing auxiliary batteries. The dc/dc converter can, e.g., be of the type manufactured and sold by TRI-MAG, inc., 8210 W. Doe Avenue, Visalia, CA 93291. Such converters accept dc input voltages ranging from 2 volts to 6 volts and deliver a constant output of 15 volts at currents of up to 50 milliameres.

Second, a voltage reference VR1 along with voltage dividing resistors R1 and R2 has been used to establish the dc bias level at the noninverting input of A1. The bias voltage thus established is somewhat more accurate than that established with the circuit of FIG. 5. Voltage reference VR1 can be simply a zener diode. Alternatively, it can be an integrated circuit voltage reference such as the 2.5 volt LM336-2.5 available from National Semiconductor Corporation.

Finally, the bipolar npn power transistor Q1 has been replaced by an n-channel power MOSFET M1 in the circuit of FIG. 6. The purpose for this enhancement is to increase the available output signal voltage driving signal current through the batter. Since with single-cell operation, only two volts is available to power the class-A output circuit, it is important to bias the output circuit exactly midway between its endpoints and to then swing it symmetrically about that bias point. Bipolar transistors suffer from saturation at high current levels. This prevents the voltage across the transistor from reaching zero, thus prohibiting it from swinging the full ± volt that is provided by a 2-volt cell undergoing test. Power MOSFETs do not have the same saturation tendency and therefore permit larger signal excursions to be obtained with small voltages.

Figure 7:
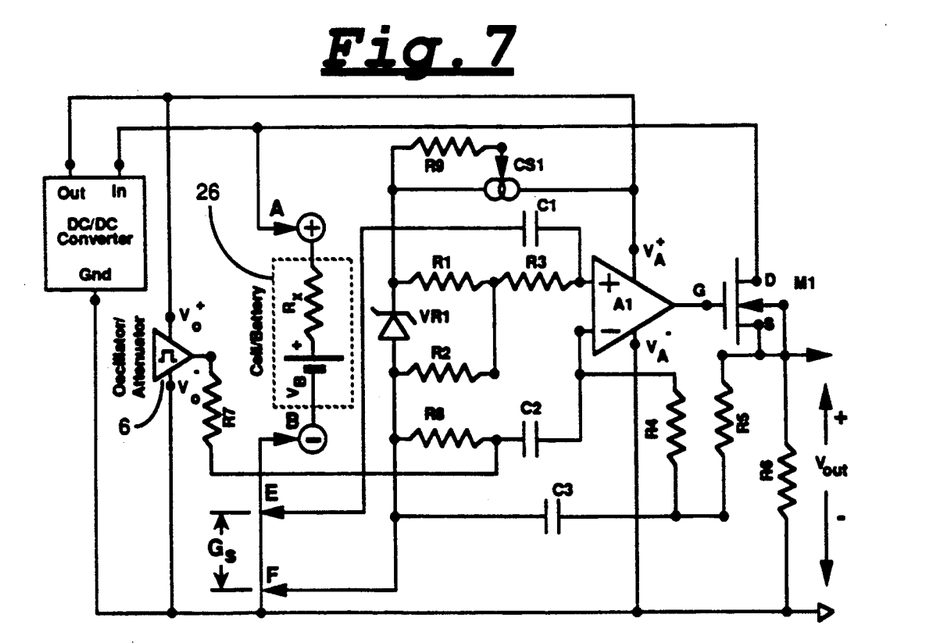
FIG. 7 is a simplified schematic diagram, similar to FIG. 6, disclosing the use of a conductance standard to precisely calibrate an electronic tester for assessing battery/cell capacity in accordance with principles of the present invention.

Referring now to FIG. 7, a technique for accurately calibrating the electronic tester in accordance with principles of the present invention is disclosed. This technique provides means for making absolute cell/battery measurements without reference to laboratory bridges or other external measuring equipment. The circuit disclosed in FIG. 7 is identical to that disclosed in FIG. 6 except that the voltage sensing contacts have been removed from the battery at points C and D and instead make contact with the conductance standard $G_S$ at points E and F. Steady-state dc operation of the circuit will be unaffected because the contact at F still contacts "ground"; and, with this embodiment, the voltage sensing contact at E only senses time-varying signals and thus provides neither bias nor power.

Conductance standard $G_S$ is placed in series with the "current loop" lead wire that contacts the battery at B. Thus, the same time-varying current that passes through the cell/battery also passes through conductance standard $G_S$. Conductance standard $G_S$ simply comprises a segment of wire having two "voltage-sensing" contacts soldered to points that are separated by an appropriately chosen distance to provide a convenient conductance value. For example, a conductance standard of exactly 1000 siemens at 20° C. can be realized by soldering E and F contacts to #18 AWG hard-drawn copper wire at points precisely 1.88 inches apart. Wire composed of such other metals as manganin, constantan, or nickel silver can be used in place of copper wire if a smaller temperature coefficient than that of copper is desired.

Since the conductance standard is simply a short length of wire, it can remain in series with the lead to battery contact B, even when it si not being used to calibrate the apparatus. Note that if the conductance standard is physically located on the circuit board of the tester, it will be separated from cell/battery contact B by many inches of lead wire. Such lead wire will have an ohmic resistance that is many times larger than that of the standard. However, because of the "four-point probe" architecture, and the isolation between loops provided by the disclosed circuit, the measuring circuit will sense only the signal voltage developed between its two voltage sensing contacts at E and F and ignore the much larger signal voltage developed across the long length of lead wire between E and B. Note also that the positioning of contacts E and F is important. If the two voltage sensing contacts were reversed so that the F contact was the one nearest the battery, positive feedback would result and the circuit would oscillate.

Figure 8:
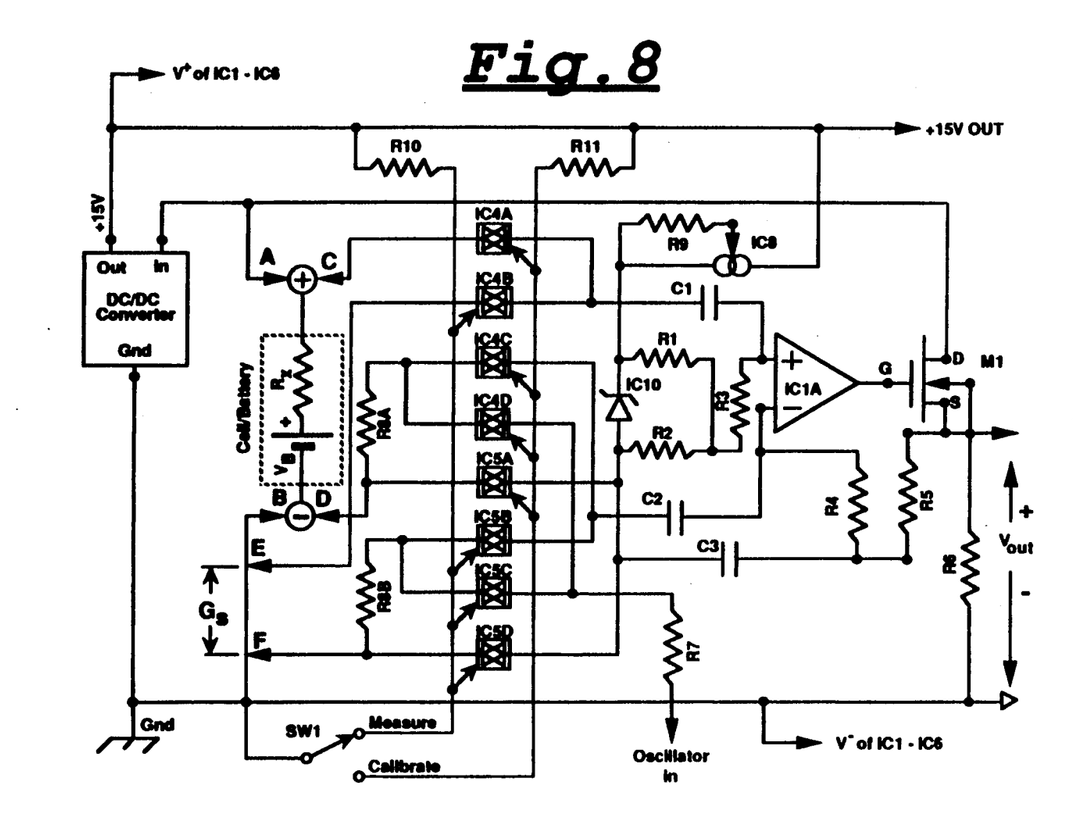
FIG. 8 is a schematic diagram of the amplifier/power supply section of a practical embodiment of an electronic tester for assessing battery/cell capacity in accordance with the present invention.
Figure 9:
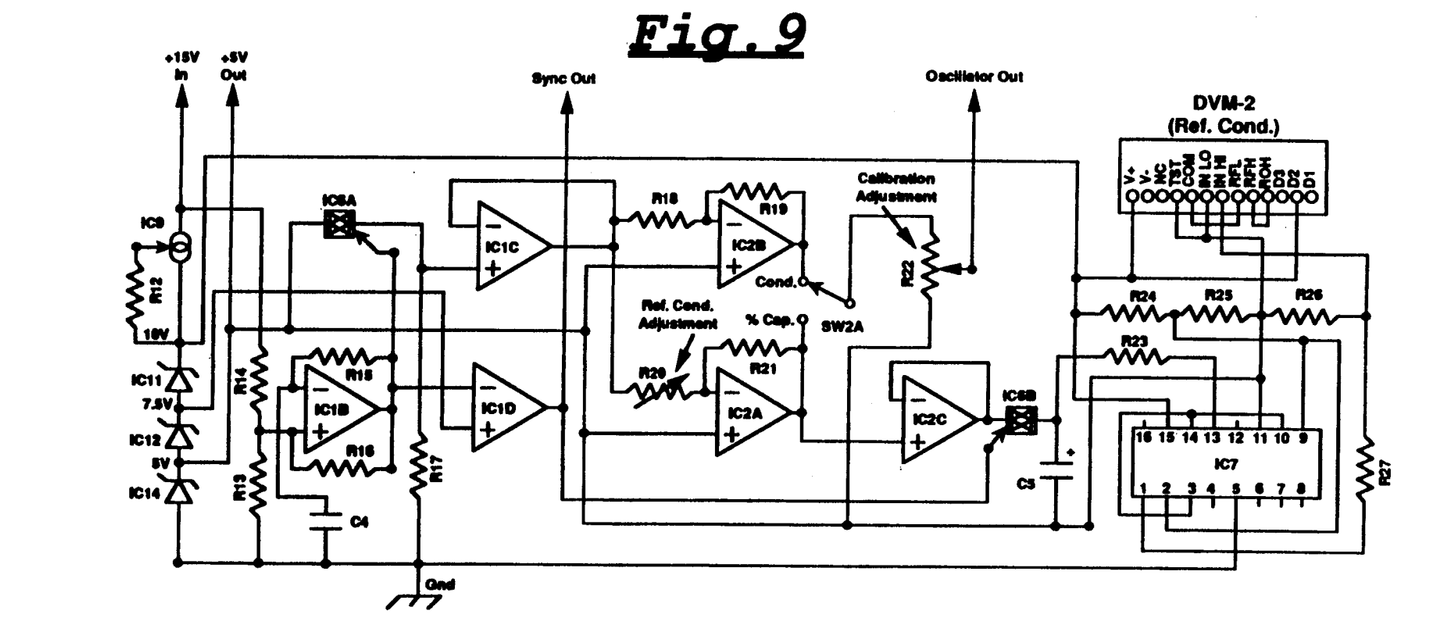
FIG. 9 is a schematic diagram of the oscillator/attenuator section of a practical embodiment of an electronic tester for assessing battery/cell capacity in accordance with the present invention.
Figure 10:
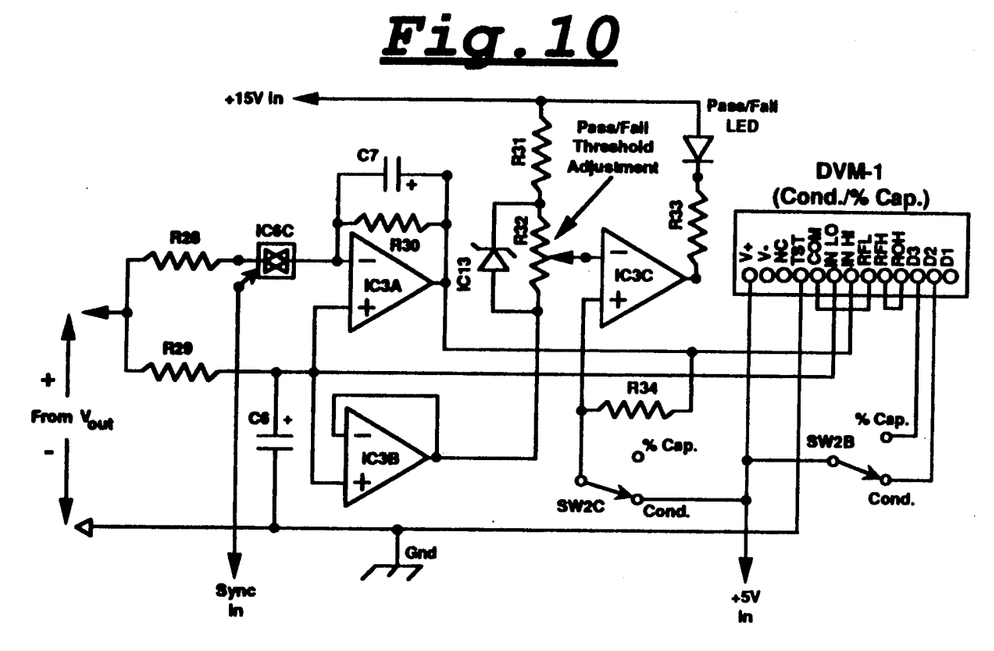
FIG. 10 is a schematic diagram of the detector/display section of a practical embodiment of an electronic tester for assessing battery/cell capacity in accordance with the present invention.

The three FIGS. FIG. 8, FIG. 9, and FIG. 10, taken together, disclose the complete schematic diagram of a practical embodiment of an electronic tester for assessing batter/cell capacity in accordance with principles of the present invention. The component values disclosed herein below are appropriate for a tester capable of measuring cells and batteries having conductance values of up to 199.99 kilosiemens. FIG. 8 discloses the complete amplifier/power supply section, 4, of the tester; FIG. 9 discloses the complete oscillator/attenuator section, 6; and FIG. 10 discloses the complete detector/display section, 8.

The amplifier/power supply section disclose din FIG. 8 combines the two functions performed by the two circuits disclosed in FIG. 6 and 7. A dc/dc converter is energized by the cell/battery undergoing test via contacts A and B. This unit provides an output voltage of 15 volts and supplies all of the power required by the electronic tester except for that required by elements of the "feedback current loop". The "feedback current loop", comprising power MOSFET M1, feedback resistor R6, and conductance standard $G_S$, is separately powered by means of direct connections to the cell/battery at contacts A and B. Adc bias voltage of 1 volt, established by voltage divider resistors R1 and R2 and voltage reference IC10, is conducted to the noninverting input of operational amplifier IC1A by resistor R3. This bais circuit receives its power from the dc/dc converter through current source IC8 which effectively isolates the bias circuit from the dc/dc converter. Resistor R9 determined the level of the dc current supplied by current source IC8.

A low-pass filter, comprising resistors R4 and R5, along with bypass capacitor C3, provides an internal dc feedback path from the amplifier output, at the junction of the source of MOSFET M1 and feedback resistor R6, to the inverting input of IC1A. Accordingly, the dc output voltage of the amplifier, as measured across R6, is stabilized at 1 volt. Since the resistance of resistor R6 is 0.5 Ω, the resulting dc bias current flowing through the conductance standard $G_S$ and the cell/battery via contacts A and B is 2 amps.

IC4 and IC5 comprise a pair of quad bilateral analog switch integrated circuits. Together they comprise eight electrically-controlled switches which are interposed between the circuitry on their left and the circuitry on their right. The control inputs of these switches connect to mode selector switch SW1 and pullup resistors R10 and R11. With mode selector switch SW1 in the "Measure" position, the control inputs of switches IC4B, IC5B, IC5C and IC5D, are grounded. This results in their assuming the nonconducting, or "open-circuit", condition. However the control inputs of the other four switches, IC4A, IC4C, IC4D, and IC5A will be pulled up to 15 volts by resistor R11, and they will thus be in the "closed", or conducting, condition. With mode selector switch SW1 in the "Calibrate" position, the two groups of switches interchange roles.

A 10 Hz square wave current, generated by circuitry in the oscillator/attenuator section 6, is conducted through "injection resistor" R7 to analog switches IC4D and IC5C. This current produces a small 10 Hz voltage across either "viewing resistor" R8A or "viewing resistor" R8B, depending upon whether SW1 is in the "Measure" position or in the "Calibrate" position, respectively.

With SW1 is in the "Measure" position, a "voltage sensing sloop" is formed comprising the signal across the cell/battery as sensed at contacts C and D, the signal across "viewing resistor" R8A, coupling capacitors C1 and C2, and the differential input of amplifier IC1A. With SW1 in the "Calibrate" position, a second "voltage sensing loop" is formed comprising the signal developed across the conductance standard $G_S$ as sensed at contacts E and F, the signal across "viewing resistor" R8B, coupling capacitors C1 and C2, and the differential input of amplifier IC1A.

By virtue of the large voltage gain of operational amplifier IC1A along with the large negative feedback provided by feedback resistor R6, the total signal voltage at the differential input of IC1A is essentially zero, thus requiring that the two signal voltages in the "voltage sensing loop" cancel one another. Accordingly, with mode selector switch SW1 in the "measure" position, the 10 Hz signal voltage developed across the cell/battery is essentially equal and opposite to that across "viewing resistor" R8A. Similarly, with mode-selector switch SW1 in the "Calibrate" position, the signal voltage developed across the conductance standard $G_S$ is essentially equal and opposite to that across "viewing resistor" R8B.

The signal voltage across feedback resistor R6 is proportional to the signal current fed back through the cell/battery and the conductance standard that results in the appropriate cancelling voltage being formed. Accordingly, with mode selector switch SW1 is in the "Measure" position, the ac signal component of voltage $V_{out}$ across R6 is proportional to the signal voltage across R8A and to the dynamic admittance of the cell/battery. With mode selector switch SW1 in the "calibrate" position, it is proportional to the signal voltage across R8B and to the dynamic admittance of conductance standard $G_S$.

FIG. 9 discloses the circuitry that generates the signal current that is injected into the circuit of FIG. 8 by "injection resistor" R7. Reference voltages of +5 volts, +7.5 volts, and +10 volts are derived from the +15 volt output of the dc/dc converter by current source IC9 along with voltage references IC11, IC12, and IC14. Resistor R12 determines the dc current level of IC9.

Operational amplifier IC1B along with resistors R13, R14, R15, R16, and capacitor C4 comprise a conventional multivibrator circuit. The output of IC1B oscillates between a low voltage near zero and a high voltage near +15 volts at approximately a 10 Hz rate. The time-varying output of IC1B is connected to the input of IC1D configured as a phase inverter. The phase-inverted output of IC1D is employed as a synchronization signal and is connected to the control input of analog switches IC6B and IC6C (in the detector/display section 8).

The time-varying output signal of IC1B is also applied to the control input of analog switch IC6A whose signal input terminal is connected to the +5 volt reference voltage. Resistor R17 insures that the signal output of IC6A is pulled completely down to zero volts when its control input is low.

With function switch SW2A in the "Conductance" position the output of the inverting amplifier having constant gain is selected. Accordingly, the fixed voltage gain ratio)$-R19/R18$) is appropriately chosen to display cell/battery conductance in kilosiemens directly. With SW2A in the "Percent Capacity" position, the variable gain amplifier is selected. Accordingly, the variable ration ($-R21/R20$) is chosen to appropriately scale the measured conductance such that the displayed quantity is equal to the percentage of a reference conductance value that has been previously entered with variable resistance R20.

The resistance of R20 is directly proportional to the value of $G_{ref}$ that corresponds to its setting. Accordingly, the relationship between $G_{ref}$ and R20 can be conveniently established by means of a linearly calibrated scale that is associated with a knob or other means for adjusting R20. However, an alternative, high precision, means for establishing and displaying this relationship is disclosed herein below.

The amplitude of the square wave output of the variable gain amplifier IC2A is inversely proportional to the resistance of R20. This square-wave signal is passed through IC2C, configured as a unit-gain voltage follower, to the signal input terminal of analog switch IC6B. By virtue of the phase inversion of this signal introduced by IC2A and the phase inversion of the synchronization signal introduced by IC1D, analog switch IC6B is in a conducting state whenever the signal square wave is high, and in a nonconducting state whenever the square wave is low. Capacitor C5, which is connected between the signal output of IC6B and the +5 volt reference voltage, therefore charges up to a dc voltage exactly equal to the amplitude of the square wave signal.

The dc voltage developed across C5 is applied to the input of multifunction converter IC7 by means of resistor R23. Integrated circuit IC7 is an LH0094CD manufactured by National Semiconductor Corporation. This IC, which will perform various mathematical functions on analog signals, is particularly configured by resistors R24 and R25 to invert the dc voltage across C5 and produce an output voltage directly proportional to its reciprocal. The output voltage of IC7 is therefore directly proportional to the resistance of R20 and to the corresponding value of $G_{ref}$.

The output voltage of IC7 is attenuated by voltage divider resistors R26 and R27. This attenuated output voltage is connected to the input terminals of a digital voltmeter DVM-2. DVM-2 is a commercially available digital panel meter manufactured by Modutec Incorporated of Norwalk, CT. The particular panel meter employed herein accepts input voltages of up to 200 millivolts, utilizes a 3½ digit LCD display, and is designated by model number BL100301. Voltage divider resistors R26 and R27 are chosen such that digital voltmeter DVM-2 displays the appropriate value of $G_{ref}$ directly in siemens.

FIG. 10 discloses the detector/display section 8 of the electronic tester. The voltage $V_{out}$, established across resistor R6 of FIG. 8, is input to the circuit of FIG. 10. As discussed with reference to FIG. 8, $V_{out}$ comprises a dc bias component of approximately one volt along with a square-wave signal component having amplitude proportional to the dynamic admittance of either the cell/battery undergoing test, or of the conductance standard.

Integrated circuits IC6C and IC3A along with resistors R28, R29, R30, and capacitor C7 comprise a synchronous detector. This circuit has been fully analyzed in U.S. Pat. No. 4,816,768. It is shown therein that C6 charges up to the dc bias component of $V_{out}$, and that the dc voltage developed between the output of IC3A and the noninverting input of IC3A is proportional to the component of the signal that is in phase with the synchronizing signal applied to the control input of IC6C. Since this synchronizing signal is in phase with the oscillator voltage developed across "viewing resistors" R8A and R8B of FIG. 8, the dc voltage between the output of IC3A and the noninverting input of IC3A is proportional to the dynamic conductance of the cell/battery undergoing test, or of the conductance standard.

The signal output of the synchronous detector connects to the differential input of digital voltmeter DVM-1 at terminals IN HI and IN LO. Accordingly, the dc voltage displayed on DVM-1 is likewise proportional to the dynamic conductance of the cell/battery undergoing test, or of the conductance standard. The constant of proportionality relating the signal level of $V_{out}$ to the value displayed on DVM-1 is determined by the ratio (R30/R28). This ratio is conveniently chosen to permit the dynamic conductance to displayed directly in siemens on DVM-1 when function switch SW2 is in the "Conductance" position. Switch section SW2B of function switch SW2 takes care of moving the displayed decimal point when changing form a "Conductance" display (XX.XX kilosiemens) to a "Percent Capacity" display (XXX.X%). DVM-1 is identical to DVM-2 and comprises a model BL100301 digital panel meter manufactured by Modutec Incorporated of Norwalk, CT.

The pass/fail display circuitry comprises IC3B, IC3C, IC3, resistors R31 through R34, and the pass/fail LED. IC3B is configured as a unity-gain voltage follower connected to the two-side of the output of the synchronous detector. The voltage at the output of IC3B is therefore at this same reference level. The voltage at the adjustable tap of trimmer potentiometer R32 is equal to this reference voltage plus an additional adjustable amount supplied by IC13 and resistor R31. This adjustable voltage is connected to the inverting input of voltage comparator IC3C. The high-side of the synchronous detector output is connected to the noninverting input of voltage comparator IC3C through resistor R34. When the dc level of the synchronous detector output is larger than the variable voltage tapped across the bottom portion of R32, the voltage at the noninverting input of IC3C will be larger than the voltage at the inverting input. Under these conditions, the output of IC3C will be in a "high" state and the pass/fail LED will be extinguished. When the dc output of the synchronous detector is less than this value, the output of IC3C will be "low". The pass/fail LED will then be excited by a current passing through resistor R33. The threshold voltage defining the signal level at which the voltage comparator changes state is determined by the setting of R32. In practice, this trimmer potentiometer may be conveniently set to correspond to a Percent Capacity value of 80%. When function switch SW2 is in the "Conductance" position, section SW2C pulls the noninverting input of IC3C up to +5 volts, thus disabling the pass/fail display circuitry.

A list of component types and values for the electronic tester disclosed in FIGS. 8, 9, and 10 follows:

| REFERENCE NUMBER | COMPONENT |
|---|---|
| Semiconductor Devices | |
| IC1, IC2, IC3 | LM324N |
| IC4, IC5, IC6 | CD4066B |
| IC7 | LH0094CD |
| IC8, IC9 | LM334Z |
| IC10, IC11, IC12, IC13 | LM336Z-2.5 |
| IC14 | LM336Z-5.0 |
| M1 | IRFZ40 PWR MOSFET |
| LED | T-1¾ Red LED |
| Resistors - Ohms (¼-W unless specified) | |
| R1 | 1.50K |
| R2 | 1.00K |
| R3 | 47K |
| R4, R5 | 3.0M |
| R6 | 0.5-5 Watt |
| R7 | 33K |
| R8A, R8B | 100 |
| R9 | 22 |
| R10, R11 | 33K |
| R12 | 8.2 |
| R13, R14 | 1.0M |
| R15 | 150K |
| R16 | 267K |
| R17 | 10K |
| R18 | 54.9K |
| R19, R21 | 10.0K |
| R20 | 100K - Variable |
| R22 | 1K - Trimpot |
| R23 | 75.0K |
| R24 | 82.5K |
| R25 | 18.7K |
| R26 | 10.0K |
| R27 | 90.0K |
| R28 | 100K |
| R29 | 49.9K |
| R30 | 105K |
| R31 | 10K |
| R32 | 100K - Trimpot |
| R33 | 1K |
| R34 | 100K |
| Capacitors - Mfd | |

-continued

| REFERENCE NUMBER | COMPONENT |
| --- | --- |
| C1 | 4.7 |
| C2, C7 | 10 |
| C3 | 0.15 |
| C4 | 0.27 |
| C5, C6 | 22 |
| Additional Components | |
| DVM-1, DVM-2 | Modutec BL100301 |
| DC/DC Converter | Tri-Mag; 15 Volt @ 50 mA |
| SW1 | 1 Pole, 2 Pos., Non-Shorting |
| SW2 | 3 Pole, 2 Pos., Non-Shorting |

Although a specific mode for carrying out the present invention has been herein described, it is to be understood that modification and variation may be made without departing from what is regarded as the subject matter of this invention. For example, a portable embodiment applicable to field testing has been disclosed herein. However, the invention, or a plurality of like inventions, could just as well be permanently attached to a battery system to serve as a monitor of battery/cell energy capacity. In addition, the particular embodiment disclosed utilizes analog circuitry to compare the measured dynamic conductance with a reference value to determine the ratio thereof. However, this ratio could just as well be determined mathematically by calculations performed by a microprocessor or a computer. Moreover, the digital displays of the disclosed embodiment could be easily replace by analog meters or by a computer terminal or printer. These, and other variations are believed to be within the scope of the invention and are intended to be covered by the appended claims.

What is claimed is:

1. A process for assessing the percent capacity of a cell or battery comprising the steps of:
   measuring the dynamic conductance of said cell or battery with a time-varying signal;
   establishing a reference dynamic conductance defined as the dynamic conductance of an identically constructed cell or battery having substantially 100 percent capacity;
   taking a ratio of said measured dynamic conductance to said reference dynamic conductance; and
   displaying said ratio expressed as a percentage.

2. A process for determining whether the percent capacity of a cell or battery is less than a predetermined value comprising the steps of:
   measuring the dynamic conductance of said cell or battery with a time-varying signal;
   establishing a reference dynamic conductance defined as the dynamic conductance of an identically constructed cell or battery having substantially 100 percent capacity;
   taking a ratio of said measured dynamic conductance to said reference dynamic conductance; and
   indicating whether said ratio is less than a predetermined value.

3. An electronic device for assessing the level of energy stored in a cell or battery relative to a reference level, said cell or battery having a dynamic conductance, comprising:
   means for measuring said dynamic conductance operably connected to said cell or battery and providing a measured dynamic conductance value;
   means for entering a reference dynamic conductance value into said electronic device;
   means for comparing said measured dynamic conductance value with said reference dynamic conductance value and determining the ratio thereof; and
   means responsive to said ratio for providing an assessment of said level of energy stored in said cell or battery relative to said reference level.

4. An electronic device in accordance with claim 3 wherein said means responsive to said ratio comprises means for indicating if said ratio is less than a predetermined value.

5. An electronic device in accordance with claim 3 wherein said means responsive to said ratio comprises means for displaying numbers proportional to said ratio.

6. An electronic device in accordance with claim 3 including means responsive to said measured dynamic conductance value for displaying said measured dynamic conductance value.

7. An electronic device in accordance with claim 6, including:
   conductance standard means for providing a conductance standard reference; and
   calibration adjustment means for adjusting said measured dynamic conductance value, wherein said means for measuring is adapted to measure said conductance standard reference, and said calibration adjustment means is adjusted to cause said means responsive to said measured dynamic conductance value for displaying said measured dynamic conductance value to display a predetermined value.

8. An electronic device in accordance with claim 3 wherein said means for measuring includes oscillator means for oscillating, voltage amplifying means for amplifying voltage, power amplifying means for amplifying power, and auxiliary dc power means for providing auxiliary dc power, wherein said power amplifying means receives dc operating power directly from said cell or battery, and said oscillator means and voltage amplifying means each receive dc operating power from said auxiliary dc power means.

9. An electronic device in accordance with claim 8 wherein said auxiliary dc power means comprises a dc to dc converter energized by said cell or battery.

10. An electronic device in accordance with claim 8 wherein said auxiliary dc power means comprises a separate battery power source.

11. An electronic device for displaying the energy capacity of a test cell or battery relative to that of a reference, comprising:
   an oscillator providing a time-varying input signal;
   a feedback amplifier, operably connected to said oscillator and to said test cell or battery, said feedback amplifier providing an output signal directly proportional to said time-varying input signal and to the admittance of said test cell or battery;
   an adjustable attenuator, operably connected to said feedback amplifier, for variably scaling the level of said output signal in concordance with the conductance of said reference;
   a detector for converting said output signal into a variably scaled dc voltage; and
   a display device, responsive to said variably scaled dc voltage, for displaying said energy capacity of said test cell or battery relative to that of said reference.

12. An electronic device in accordance with claim 11 wherein said display device includes a signaling device for providing a qualitative indication of the size of said variably scaled dc voltage relative to a predetermined value.

13. An electronic device in accordance with claim 12 wherein said signaling device comprises a light emitting diode.

14. An electronic device in accordance with claim 11 wherein said display device comprises a numerical display device for displaying numbers proportional to said variably scaled dc voltage.

15. An electronic device in accordance with claim 11, including a numerical conductance display, further comprising:
- a fixed attenuator, operably connected to said feedback amplifier, for constantly scaling the level of said output signal;
- a detector for converting said output signal into a constantly scaled dc voltage; and
- a numerical conductance display, responsive to said constantly scaled dc voltage, for displaying numbers proportional to said constantly scaled dc voltage.

16. An electronic device in accordance with claim 15, including a calibration circuit, further comprising:
- a conductance standard operably connected to said cell or battery;
- a switch interconnecting said conductance standard, said test cell or battery, and said feedback amplifier means, said switch capable of adapting said feedback amplifier to provide an output signal that is independent of said admittance of said test cell or battery and directly proportional to the conductance of said conductance standard; and
- a calibration variable attenuator, operably connected to said feedback amplifier, and adapted to setting the level of said output signal in concordance with the conductance of said conductance standard with said feedback amplifier adapted to provide an output signal that is independent of said admittance of said test cell or battery and directly proportional to the conductance of said conductance standard.

17. An electronic device in accordance with claim 11 including an auxiliary dc power source, wherein said feedback amplifier comprises a voltage amplifier and a power amplifier, said power amplifier receiving dc operating power directly from said cell or battery and said voltage amplifier and sad oscillator each receiving dc operating power from said auxiliary dc power source.

18. An electronic device in accordance with claim 17 wherein said auxiliary dc power source comprises a dc to dc converter energized by said cell or battery.

19. An electronic device in accordance with claim 17 wherein said auxiliary dc power source comprises a separate battery power source.

20. An electronic device for testing a cell or battery comprising:
- an auxiliary dc power source;
- a high-gain amplifier having an input and an output comprising a voltage amplifier and a power amplifier, said power amplifier adapted to receive dc operating power directly from said cell or battery, and said voltage amplifier adapted to receive dc operating power and dc input bias from said auxiliary dc power source, said dc input bias being passed through an isolating current source;
- internal voltage-feedback means for providing voltage feedback to said high-gain amplifier, including a low-pass filter interconnecting the output and the input of said high-gain amplifier;
- external current-feedback means for providing current feedback to said high-gain amplifier, including a feedback resistance conducting a current from the output of said high-gain amplifier through said cell or battery;
- oscillator means for producing a periodic oscillator signal, said oscillator means adapted to receive dc operating power from said auxiliary dc power source;
- voltage summing and coupling means for adding a voltage derived from said periodic oscillator signal to a voltage across said cell or battery, and capacitively coupling the sum voltage to said input of said high-gain amplifier;
- detector means for producing a dc output signal in response to an ac voltage across said feedback resistance; and
- indicating means, responsive to the level of said dc output signal, for indicating results of said test.

21. An electronic device in accordance with claim 20 wherein said auxiliary dc power source comprises a dc to dc converter energized by said cell or battery.

22. An electronic device in accordance with claim 20 wherein said auxiliary dc power source comprises a separate battery power source.

23. An electronic device in accordance with claim 20 wherein said indicating means provides a qualitative response to said level of said dc output signal.

24. An electronic device in accordance with claim 20 wherein said indicating means provides a quantitative response to said level of said dc output signal.

25. An electronic device employing a time-varying current to test a cell or battery comprising:
- a pair of current-carrying contacts operably contacting said cell or battery;
- a power amplifier operably arranged to receive dc operating power from said cell or battery by means of said current-carrying contacts and to pass said time-varying current through said cell or battery by means of said current-carrying contacts, said time-varying current producing a time-varying signal voltage across said cell or battery;
- a pair of voltage-sensing contacts sensing said time-varying signal voltage across said cell or battery;
- an auxiliary dc power source;
- a voltage amplifier operably arranged to receive dc operating power from said auxiliary dc power source and to amplify an input signal derived from said time-varying signal voltage across said cell or battery as sensed by said voltage-sensing contacts;
- a detector operably arranged to provide a dc signal voltage proportional to the time-varying output signal of said voltage amplifier; and
- a display device, responsive to the level of said dc signal voltage, displaying results of said test.

26. An electronic device in accordance with claim 25 wherein said auxiliary dc power source comprises a dc to dc converter energized by said cell or battery through said current-carrying contacts.

27. An electronic device in accordance with claim 25 wherein said auxiliary dc power source comprises a separate battery power source.

28. An electronic device in accordance with claim 25 wherein said power amplifier comprises a bipolar power transistor.

29. An electronic device in accordance with claim 25 wherein said power samplifier comprises a power MOSFET.

30. An electronic device in accordance with claim 25 wherein said display device provides a qualitative indication of a magnitude of said level of said dc signal voltage relative to a reference level.

31. An electronic device in accordance with claim 25 wherein said display device displays numbers proportional to said level of said dc signal voltage.

32. An electronic circuit providing a dc output signal directly proportional to the conductance of a length of conductor connected in series with a cell or battery comprising:
- an amplifier cascade comprising a high-gain voltage amplifier followed by a power amplifier;
- a dc voltage-feedback network, including a low-pass filter network, said dc voltage-feedback network interconnecting the output terminals of said power amplifier with the input terminals of said high-gain voltage amplifier;
- an ac feedback current loop, including a feedback resistor, said ac feedback current loop comprising the series interconnection of the output terminals of said power amplifier, said length of conductor, said cell or battery, and said feedback resistor;
- an oscillator circuit producing a periodic oscillator signal;
- a first pair of voltage-sensing contacts sensing a voltage developed across said length of conductor;
- a voltage summing and coupling network adding a voltage derived from said periodic oscillator signal to said voltage sensed by said first pair of voltage-sensing contacts and capacitively coupling a sum voltage to the input terminals of said high-gain voltage amplifier; and
- a detector circuit, responsive to an ac current flowing in said ac feedback current loop, and producing said dc output signal in proportion to the component of said ac current that is in phase with said periodic oscillator signal.

33. An electronic circuit in accordance with claim 32 wherein said power amplifier comprises a bipolar power transistor and said power amplifier output terminals comprise emitter and collector terminals.

34. An electronic circuit in accordance with claim 32 wherein said power amplifier comprises a power MOSFET and said power amplifier output terminals comprise source and drain terminals.

35. An electronic circuit in accordance with claim 32 including an auxiliary dc power source providing operating power to said oscillator circuit and to said high-gain voltage amplifier.

36. An electronic circuit in accordance with claim 35 wherein said auxiliary dc power source comprises a dc to dc converter energized by said cell or battery.

37. An electronic circuit in accordance with claim 35 wherein said auxiliary dc power source comprises a separate battery power source.

38. An electronic circuit in accordance with claim 32 including means for changing operational modes from a first operational mode providing a dc output signal directly proportional to the conductance of said length of conductor to a second operational mode providing a dc output signal directly proportional to the conductance of said cell or battery, said means for changing operational modes comprising:
- a second pair of voltage-sensing contacts sensing a voltage developed across said cell or battery; and
- a mode selector switch, interposed between said first and second pairs of voltage-sensing contacts and said voltage summing and coupling network, and arranged to select either said voltage sensed by said first pair of voltage-sensing contacts in said first operational mode, or said voltage sensed by said second pair of voltage-sensing contacts in said second operational mode, for presentation to said voltage summing and coupling network.

39. An electronic circuit in accordance with claim 38 wherein said electronic circuit includes a dc output signal level adjustment and said length of conductor comprises a conductance standard, said electronic circuit being calibrated by adjusting said dc output signal level adjustment to place said dc output signal level in concordance with the conductance value of said conductance standard with said selector switch selecting said first operational mode.

40. A process for assessing the condition of a deep-cycle cell or battery relative to that of a reference cell or battery comprising the steps of:
- passing a time-varying current through deep-cycle cell or battery and sensing a time-varying voltage across said deep-cycle cell or battery;
- determining a measured ratio of a component of said time-varying current to a component of said time-varying voltage;
- comparing said measured ratio with a reference ratio appropriate to said reference cell or battery; and
- displaying the result of said comparison.

41. A process as in claim 40 wherein said result of said comparison is displayed with numbers that are proportional to said measured ratio divided by said reference ratio.

42. A process as in claim 40 wherein said result of said comparison is displayed by indicating whether said measured ratio is greater or less than a particular fraction of said reference ratio.

43. An electronic device for assessing the condition of a deep-cycle cell or battery relative to that of a reference cell or battery comprising:
- means operably connected to said deep-cycle cell or battery for passing a time-varying current through said deep-cycle cell or battery and for sensing a time-varying voltage across said deep-cycle cell or battery;
- means for determining a measured ratio of a component of said time varying current to a component of said time-varying voltage;
- means for comparing said measured ratio with a reference ratio appropriate to said reference cell or battery; and
- means for displaying the result of said comparison.

44. An electronic device as in claim 43 wherein said means for displaying the result of said comparison displays numbers that are proportional to said measured ratio divided by said reference ratio.

45. An electronic device as in claim 43 wherein said means for displaying the result of said comparison indicates whether said measured ratio is greater or less than a particular fraction of said reference ratio.

* * * * *

UNITED STATES PATENT AND TRADEMARK OFFICE
CERTIFICATE OF CORRECTION

PATENT NO. : 5,140,269

DATED : August 18, 1992

INVENTOR(S) : KEITH S. CHAMPLIN

It is certified that error appears in the above-identified patent and that said Letters Patent is hereby corrected as shown below:

Col. 19, line 47, delete "sad", insert "said"

Col. 21, line 2, delete "samplifier", insert "amplifier"

Signed and Sealed this

Nineteenth Day of October, 1993

Attest:

BRUCE LEHMAN

Attesting Officer          Commissioner of Patents and Trademarks